(12) United States Patent
Yoshino et al.

(10) Patent No.: US 8,889,039 B2
(45) Date of Patent: Nov. 18, 2014

(54) PASTE COMPOSITION FOR SOLAR BATTERY ELECTRODE

(75) Inventors: Yasushi Yoshino, Nagoya (JP); Takahiro Sugiyama, Nagoya (JP); Shinji Senda, Nagoya (JP); Yuuko Suzuki, Nagoya (JP)

(73) Assignee: Noritake Co., Limited, Nagoya-shi (JP)

( * ) Notice: Subject to any disclaimer, the term of this patent is extended or adjusted under 35 U.S.C. 154(b) by 210 days.

(21) Appl. No.: 13/395,814

(22) PCT Filed: Sep. 2, 2010

(86) PCT No.: PCT/JP2010/065072
§ 371 (c)(1),
(2), (4) Date: Mar. 13, 2012

(87) PCT Pub. No.: WO2011/033945
PCT Pub. Date: Mar. 24, 2011

(65) Prior Publication Data
US 2012/0168691 A1    Jul. 5, 2012

(30) Foreign Application Priority Data

Sep. 18, 2009  (JP) ................. 2009-217945

(51) Int. Cl.
*H01B 1/16* (2006.01)
*H01B 1/22* (2006.01)
*H01L 31/0224* (2006.01)

(52) U.S. Cl.
CPC .......... *H01B 1/22* (2013.01); *H01L 31/022425* (2013.01); *Y02E 10/50* (2013.01)
USPC .......................................... 252/512; 252/514

(58) Field of Classification Search
CPC .............. H01B 1/16; H01B 1/22; C09D 5/24; C03C 3/00; C03C 4/14; C03C 12/00; C03C 14/006; H05K 1/0296; H05K 1/092; H01L 23/49883
USPC .................................. 252/512–514; 106/1.14
See application file for complete search history.

(56) References Cited

U.S. PATENT DOCUMENTS

| 4,256,513 A | 3/1981 | Yoshida et al. |
| 4,737,197 A | 4/1988 | Nagahara et al. |

(Continued)

FOREIGN PATENT DOCUMENTS

| CN | 1881621 A | 12/2006 |
| JP | A-55-103775 | 8/1980 |

(Continued)

OTHER PUBLICATIONS

International Search Report issued in International Application No. PCT/JP2010/065072 dated Dec. 21, 2010.

(Continued)

*Primary Examiner* — Mark Kopec
(74) *Attorney, Agent, or Firm* — Oliff PLC (57) ABSTRACT

It is provided a paste composition for a solar battery electrode, that includes electrically conductive powder, glass frit, and a vehicle, wherein the glass frit is made of glass that comprises, as amounts converted into those of oxides as ratios, $Li_2O$ within a range from 0.6 to 18 [mol %], PbO within a range from 20 to 65 [mol %], $B_2O_3$ within a range from 1 to 18 [mol %], and $SiO_2$ within a range from 20 to 65 [mol %].

18 Claims, 1 Drawing Sheet

(56) References Cited

U.S. PATENT DOCUMENTS

| | | | |
|---|---|---|---|
| 5,338,708 A * | 8/1994 | Felten | 501/19 |
| 5,363,271 A * | 11/1994 | Pepin | 361/320 |
| 5,661,041 A | 8/1997 | Kano | |
| 5,670,089 A * | 9/1997 | Oba et al. | 252/514 |
| 7,462,304 B2 | 12/2008 | Wang et al. | |
| 7,556,748 B2 | 7/2009 | Wang et al. | |
| 2006/0102228 A1* | 5/2006 | Sridharan et al. | 136/256 |
| 2006/0272700 A1 | 12/2006 | Young et al. | |
| 2010/0096598 A1 | 4/2010 | Sridharan et al. | |
| 2013/0099181 A1 | 4/2013 | Yoshino et al. | |

FOREIGN PATENT DOCUMENTS

| | | |
|---|---|---|
| JP | A-59-168667 | 9/1984 |
| JP | B2-62-028597 | 6/1987 |
| JP | B2-03-046985 | 7/1991 |
| JP | A-06-093307 | 4/1994 |
| JP | A-08-148446 | 6/1996 |
| JP | A-10-012043 | 1/1998 |
| JP | A-11-213754 | 8/1999 |
| JP | B2-3050064 | 6/2000 |
| JP | B2-3707715 | 10/2005 |
| JP | WO 2006/055126 A2 | 5/2006 |
| JP | A-2006-302890 | 11/2006 |
| JP | A-2006-302891 | 11/2006 |
| JP | A-2008-520094 | 6/2008 |
| JP | A-2009-099781 | 5/2009 |
| JP | A-2009-194121 | 8/2009 |
| WO | WO 2009/134646 A1 | 11/2009 |

OTHER PUBLICATIONS

Nov. 2, 2012 Office Action issued in Chinese Patent Application No. 201080041275.X (with translation).

Jul. 1, 2013 Office Action issued in Chinese Patent Application No. 201080041275.X (with partial translation).

Dec. 10, 2013 Office Action issued in U.S. Appl. No. 13/806,239.

Feb. 12, 2013 International Preliminary Report on Patentability issued in International Application No. PCT/JP2011/063969.

* cited by examiner

PASTE COMPOSITION FOR SOLAR BATTERY ELECTRODE

TECHNICAL FIELD

The present invention relates to a paste composition suitable for a solar battery electrode that is formed using a fire-through method.

BACKGROUND ART

A common silicon-based solar battery has a structure that, for example, includes a reflection preventing film and a light-receiving face electrode through an $n^+$-layer on a top face of a silicon substrate that is a p-type polycrystalline semiconductor and that also includes a back face electrode (hereinafter, simply referred to as "electrode" when these electrodes are not distinguished from each other) through a $p^+$-layer on a bottom face of the silicon substrate. The common silicon-based solar battery is configured to take out electric power through the electrodes, that is generated in a p-n-junction of the semiconductor due to reception of light. The reflection preventing film is a film to increase the light reception efficiency by reducing the surface reflection coefficient maintaining the sufficient visible-light transmission coefficient, and is formed by a thin film such as that of silicon nitride, titanium dioxide, or silicon dioxide.

The reflection preventing film has a high electric resistance value and, therefore, obstructs efficiently taking out the electric power generated in the p-n-junction of the semiconductor. Therefore, the light-receiving face electrode of the solar battery is formed using, for example, a method referred to as "fire-through". According to this electrode forming method, for example: the reflection preventing film is provided for the $n^+$-layer over the whole top face thereof; thereafter, an electrically conductive paste is applied to the reflection preventing film into a proper shape thereon using, for example, a screen printing method; and the work is applied with a baking process. The electrically conductive paste includes as its main components, for example: silver powder; glass frit (flake-like or powder-like glass pieces acquired by melting a glass material, rapidly cooling the melted glass material, and, thereafter, crushing the cooled glass material when necessary); an organic vehicle; and an organic solvent. During the baking process, the glass component in the electrically conductive paste breaks the reflection preventing film and, therefore, ohmic contact is formed by an electrically conductive component in the electrically conductive paste and the $n^+$-layer therebetween (see, e.g., Patent Document 1). Compared to the case where a portion of the reflection preventing film is removed and the electrode is formed in the portion that has the film removed therefrom, according to the electrode forming method, the process procedure thereof is simplified and no problem arises of misalignment of the film-removed portion and the position to form the electrode with each other.

For this forming procedure of the light-receiving face electrode of a solar battery, various suggestions have conventionally been made for purpose of improving the fire-through property, thereby, improving the ohmic contact, and consequently improving the fill factor (FF) and the energy conversion efficiency. For example, according to one of the suggestions: an element of the fifth group such as phosphorus, vanadium, or bismuth is added to the electrically conductive paste; thereby, the oxidation and reduction actions are facilitated of the glass and silver on the reflection preventing film; and, thereby, the fire-through property is improved (see, e.g., Patent Document 1). According to another of the suggestions: a chloride, a bromide, or a fluoride is added to the electrically conductive paste; thereby, the additive assists the action of breaking the reflection preventing film by glass and silver; and, thereby, the ohmic contact is improved (see, e.g., Patent Document 2). The glass in this case is, for example, borosilicate glass.

For a silver-including paste that includes 85 to 99 [wt %] of silver and 1 to 15 [wt %] of glass, it has been suggested to set the composition of the glass to include 15 to 75 [mol %] of PbO and 5 to 50 [mol %] of $SiO_2$ and to include no $B_2O_3$ (see, e.g., Patent Document 3). It is described that the silver-including paste is for use in forming an electrode of a solar battery and that the ohmic contact thereof is improved by using the glass having the above composition.

A thick-film electrically conductive composition has been proposed that is formed by dispersing in an organic solvent: silver powder; an additive including zinc; and glass frit having a softening point in a range from 300 to 600 [° C.] (see, e.g., Patent Document 4). The thick-film electrically conductive composition is for use in forming a light-receiving face electrode of a solar battery, and the electric conductivity and the solder-bonding property thereof are improved by the addition of zinc. For same reason, it is proposed to use an additive including manganese instead of using the additive including zinc. (see e.g., Patent Document 5)

PRIOR ART DOCUMENTS

Patent Documents

Patent Document 1: Japanese Patent Publication No. 03-046985
Patent Document 2: Japanese Patent Publication No. 3707715
Patent Document 3: International Patent Publication No. 2008-520094
Patent Document 4: Japanese Laid-Open Patent Publication No. 2006-302890
Patent Document 5: Japanese Laid-Open Patent Publication No. 2006-302891

DISCLOSURE OF THE INVENTION

Problem that the Invention is to Solve

In the above solar battery, the light-receiving face electrode blocks the entering sunlight and, therefore, the amount of energy entering a solar battery cell is reduced corresponding to the area accounted for by the light-receiving face electrode. Coping with this, it is considered to increase the light-receiving area by reducing the line width of the light-receiving face electrode. However, excellent ohmic contact becomes more difficult to be acquired and the contact resistance becomes higher as the line width becomes smaller, and a decrease of the current density consequently occurs. Therefore, the conversion efficiency is all the more reduced.

When the line width of the light-receiving face electrode is reduced, the cross-sectional area of the electrode is also reduced and, therefore, the line resistance is increased. It is considered to suppress the increase of the resistance by increasing the ratio of an electrically conductive component by reducing the amount of glass. However, the reactivity of the paste with the reflection preventing film becomes weaker as the amount of glass becomes smaller, and the fire-through property is consequently degraded. Therefore, the ohmic contact is further degraded.

The present invention was conceived in view of the above circumstances and the object thereof is to provide a paste composition for a solar battery electrode, that enables reduction of the line width of a light-receiving face electrode without any degradation of the ohmic contact and the line resistance.

Means for Solving the Problems

To achieve the object, the present invention provides a paste composition for a solar battery electrode, that comprises electrically conductive powder, glass frit, and a vehicle, wherein the glass frit is made of glass that comprises, as amounts converted into those of oxides as ratios, $Li_2O$ within a range from 0.6 to 18 [mol %], PbO within a range from 20 to 65 [mol %], $B_2O_3$ within a range from 1 to 18 [mol %], and $SiO_2$ within a range from 20 to 65 [mol %].

The Effects of the Invention

In this way, the paste composition for a solar battery electrode includes the glass frit constituting it, and including the glass that includes $Li_2O$ in a range from 0.6 to 18 [mol %], PbO in a range from 20 to 65 [mol %], $B_2O_3$ in a range from 1 to 18 [mol %], and $SiO_2$ in a range from 20 to 65 [mol %] and, therefore, an excellent fire-through property is acquired when the light-receiving face electrode is formed by applying the paste composition to the reflection preventing film. Therefore, even when the line width is reduced, excellent ohmic contact is acquired. Moreover, the amount of glass is reducible maintaining the excellent ohmic contact because the paste composition of the present invention has the excellent fire-through property. Therefore, it has an advantage that the line resistance of the light-receiving face electrode is further reducible. Therefore, according to the paste composition for a solar battery of the present invention, reduction of the line width of the light-receiving face electrode is enabled associated with no degradation of the ohmic contact and the line resistance. As a result, even when the light-receiving area is increased by reducing the line width, the fill factor is not lowered because the contact resistance is sufficiently low and, therefore, the solar battery cell is acquired with high photoelectric conversion efficiency.

Because the reduction of the line width is enabled as above, the paste composition has an advantage that the paste composition is also suitably used for a shallow emitter that has high sheet resistance. Incidentally, the shallow emitter refers to an emitter that is set to be shallower to have the n-layer on the light-receiving face side that has a thickness of 70 to 100 [nm] compared to that of the conventional silicon solar battery cell, that is 100 to 200 [nm]. With the shallow emitter, of the electricity generated by the reception of the light, a portion is reduced that is not effectively utilized by being converted into heat before reaching the p-n-junction. Therefore, an advantage is achieved that the short-circuit current is increased and the power generation efficiency is consequently increased. However, in general, the donor element concentration is reduced and, therefore, the barrier obstacle between Ag and Si is enhanced and the contact resistance is increased. The composition glass is able to sufficiently include the donor element and, therefore, the contact resistance is reducible. On the contrary, because the n-layer is thin, the forming of the electrode using the fire-through method needs to more strictly be controlled. However, the paste composition for an electrode of the present invention includes the glass having the above composition and, therefore, the erosion action is easily controlled.

In the composition of the glass frit, PbO is a component that lowers the softening point of the glass and is also a component to enable the baking at a low temperature. The amount of PbO needs to be equal to or more than 20 [mol %] and equal to or less than 65 [mol %] to acquire an excellent fire-through property. When the amount of PbO is less than 20 [mol %], the softening point becomes too high and, therefore, the erosion into the reflection preventing film becomes difficult and no excellent ohmic contact is consequently acquired. On the other hand, when the amount of PbO exceeds 65 [mol %], the softening point becomes too low and, therefore, the erosion action becomes too active. Therefore, problems arise such as breakage of the p-n-junction. More preferably, the amount of PbO is equal to or more than 22.4 [mol %] and, more preferably, is equal to or less than 50.8 [mol %]. Yet more preferably, the amount of PbO is in a range from 22.4 to 50.8 [mol %]. Especially preferably, the amount of PbO is about 30 to 40 [mol %].

$B_2O_3$ is a glass-forming oxide (that is, a component that forms the skeleton of glass) and is a component to lower the softening point of the glass. The amount of $B_2O_3$ needs to be equal to or more than 1 [mol %] and equal to or less than 18 [mol %] to acquire an excellent fire-through property. When the amount of $B_2O_3$ is less than 1 [mol %] the softening point becomes too high and, therefore, the erosion into the reflection preventing film becomes difficult and no excellent ohmic contact is consequently acquired and the humidity resistance is also degraded. Especially, in the present invention of the present application, the glass includes Li and, therefore, the paste composition becomes significantly difficult to be melted when the paste composition does not include equal to more than 1 [mol %] of $B_2O_3$. On the other hand, when the amount of $B_2O_3$ exceeds 18 [mol %], the softening point becomes too low and, therefore, the erosion action becomes too active. Therefore, problems arise such as breakage of the p-n-junction. More preferably, the amount of $B_2O_3$ is equal to or more than 2.8 [mol %] and, more preferably, is equal to or less than 12 [mol %]. Yet more preferably, the amount of $B_2O_3$ is in a range from 2.8 to 12 [mol %]. Especially preferably, the amount of $B_2O_3$ is about 6 to 12 [mol %].

$SiO_2$ is a glass-forming oxide and is a component to enhance the chemical resistance of the glass. The amount of $SiO_2$ needs to be equal to or more than 20 [mol %] and equal to or less than 65 [mol %] to acquire an excellent fire-through property. When the amount of $SiO_2$ is less than 20 [mol %], the chemical resistance is insufficient and the forming of the glass is difficult. On the other hand, when the amount of $SiO_2$ exceeds 65 [mol %], the softening point becomes too high and, therefore, the erosion into the reflection preventing film becomes difficult and no excellent ohmic contact is consequently acquired. More preferably, the amount of $SiO_2$ is equal to or more than 27.0 [mol %] and, more preferably, is equal to or less than 48.5 [mol %]. Yet more preferably, the amount of $SiO_2$ is in a range from 27.0 to 48.5 [mol %]. Especially preferably, the amount of $SiO_2$ is in a range about from 30 to 35 [mol %].

$Li_2O$ is a component that lowers the softening point of the glass. The amount of $Li_2O$ needs to be equal to or more than 0.6 [mol %] and equal to or less than 18 [mol %] to acquire an excellent fire-through property. When the amount of $Li_2O$ is less than 0.6 [mol %], the softening point becomes too high and the erosion action to the reflection preventing film consequently becomes insufficient. On the other hand, when the amount of $Li_2O$ exceeds 18 [mol %], the erosion action becomes too active and, therefore, the electric properties are all the more degraded. Incidentally, Li is generally an impurity for a semiconductor because Li facilitates diffusion, and is an element that is desired to be avoided for use concerning semiconductors because Li tends to degrade properties. Especially, when Li is included together with a large amount of Pb, the erosion action usually tends to be too active and control thereof tends to be difficult. However, in the above use for a solar battery, no degradation of the properties is recognized when the glass including Li is used, and the fire-through property is all the more improved and, therefore, improvement of the properties is recognized because a suitable amount of Li is included. Li is a donor element and is also able to reduce the contact resistance. In addition, by setting the composition to include Li, expansion is recognized of the composition range of the glass with which an excellent fire-through property is acquired. However, even in the use for the solar battery, when Li is excessively included, the erosion action becomes too active and the electric properties tend to be degraded. More preferably, the amount of $Li_2O$ is equal to or more than 6 [mol %] and, more preferably, is equal to or less than 12 [mol %]. Yet more preferably, the amount of $Li_2O$ is in a range from 6 to 12 [mol %]. Especially preferably, the amount of $Li_2O$ is about 6 [mol %].

Incidentally, Patent Documents 4 and 5 each describe lead glass including a trace of Li that is equal to or less than 0.1 [wt %] (=equal to or less than 0.58 [mol %]). These documents also describe that the glass including Li is usable in a paste composition for an electrode. However, these documents do not describe any advantage of including Li and also do not explain the reason why the amount of Li is set to be equal to or less than 0.1 [wt %]. Whereas, the inventor, etc., found that, unexpectedly, the fire-through property was improved and, even when the line width of the electrode pattern was reduced, excellent ohmic contact was acquired, by using glass that included a large amount of Li to the extent that the amount was conventionally never permissible as above, and the present invention was conceived based on this finding.

Though it is necessarily not easy to identify in what form each of the above components is included in the glass, the ratio of the component is represented by that of its oxide-converted value.

The glass constituting the paste for an electrode of the present invention is able to include other various glass-constituting components and additives within the ranges within which the components and additives do not degrade the property of the glass. For example, such elements may be included as Al, Zr, Na, Ca, Zn, Mg, K, Ti, Ba, and Sr. Al is a component that is effective in acquiring the stability of the glass and, therefore, substantially does not influence the property. However, preferably, Al is included. These elements are able to be included in total in a range, for example, equal to or less than 30 [mol %] For example, preferably, the amount of each of Al and Ti included is equal to or less than 6 [mol %] and, more preferably, this amount is equal to or less than 3 [mol %]. Preferably, the amount of Zn included is equal to or less than 30 [mol %] and, more preferably, this amount is equal to or less than 15 [mol %]. By setting the composition to include a suitable amount of each of Al, Ti and Zn, the shunt resistance Rsh is improved and the open-circuit voltage $V_{oc}$ and the short-circuit current $I_{sc}$ are consequently improved. Therefore, more improved electric properties are acquired.

Preferably, the glass frit has an average particle diameter (D50) within a range from 0.3 to 3.0 [μm], and wherein the paste comprises the glass frit at a ratio within a range from 1 to 20 [vol %] to a whole amount of the paste. When the average particle diameter of the glass frit is too small, melting thereof is too quick during the baking of the electrode and, therefore, the electric properties are degraded. However, when the average particle diameter is equal to or larger than 0.3 [μm], a suitable melting property is acquired and, therefore, the electric properties are further improved. In addition, no aggregation tends to occur and, therefore, a more excellent dispersion property is acquired during the preparation of the paste. When the average particle diameter of the glass frit is significantly larger than the average particle diameter of the electrically conductive powder, the dispersion property of the whole powder is also degraded. However, when the average particle diameter is equal to or smaller than 3.0 [μm], a more excellent dispersion property is acquired. In addition, an improved melting property of the glass is acquired. When the amount of glass is equal to or more than 1 [vol %], the fusing property of the reflection preventing film is further improved and, therefore, more excellent ohmic contact is acquired. When the amount of glass is equal to or less than 20 [vol %], the insulating layer becomes more difficult to be formed and, therefore, higher electric conductivity is acquired. Therefore, preferably, the above average particle diameter and the ratio in the paste are simultaneously satisfied to acquire more excellent ohmic contact. Especially, preferably, the ratio in the paste is 2 to 10 [vol %].

The average particle diameter of the glass frit is a value acquired by air permeability method. The air permeability method refers to a method of measuring the specific surface area of powder from the permeability of a fluid (for example, air) against a layer of the powder. This measuring method is based on the Kozeny-Carmann Equation that expresses the relation between the wetted surface area of all the particles constituting the layer of the powder, and the flow speed and the pressure drop of the fluid permeating through the layer and, according to the method, the specific surface area of a specimen is acquired by measuring the flow speed and the pressure drop against the layer of the powder filled under the conditions determined by an apparatus. According to this method: the wetted surface area is acquired of the particle groups that resist the air flow regarding as pores gaps among the powder particles filled; and a smaller value of the specific surface area is usually presented than that acquired using a gas adsorption method. When it is assumed that powder particles constitute the glass frit, the average particle diameter is able to be calculated from the above specific surface area acquired and the particle density.

Preferably, the electrically conductive powder is silver powder that has an average particle diameter (D50) within a range from 0.3 to 3.0 [μm]. Copper powder, nickel powder, etc., are usable as the electrically conductive powder. However, most preferably, silver powder is used to acquire high electric conductivity. When the average particle diameter of the silver powder is equal to or smaller than 3.0 [μm], more excellent dispersion property is acquired and, therefore, higher electric conductivity is acquired. When the average particle diameter is equal to or larger than 0.3 [μm], the aggregation is suppressed and, therefore, a more excellent dispersion property is acquired. However, silver powder having the average particle diameter smaller than 0.3 [μm] is significantly expensive and, therefore, preferably, the average particle diameter thereof is equal to or larger than 0.3 [μm] also from the viewpoint of the manufacturing cost. When the average particle diameters of the electrically conductive powder and the glass frit are both equal to or smaller than 3.0 [μm], an advantage is achieved that no clogging tends to occur even when the electrode is formed by printing using a thin-line pattern.

The silver powder is not especially limited and, even when powder having any shape is used such as a ball-like shape or a scale-like shape, the basic effect of the present invention is able to be enjoyed that the line width is reducible maintaining the electric conductivity. However, when powder having a ball-like shape is used, the printability is excellent and the filling factor of the silver powder is high in the coated film. Therefore, with the effect of using silver that has high electric conductivity, the specific electric conductivity is high of the electrode produced from the coated film, compared to the case where the silver powder having another shape such as the scale-like shape is used. Therefore, the line width is further reducible securing the necessary electric conductivity. Therefore, especially preferably, the silver powder having the ball-like shape is used.

Preferably, the paste composition for a solar battery electrode includes a viscosity at 25 [° C.] and 20 [rpm] being within a range from 150 to 250 [Pa·s], and wherein a relative viscosity (that is, a viscosity at 10 [rpm]/a viscosity at 100 [rpm]) being 3 to 8. By using the paste having this viscosity property, the viscosity of the paste is suitably lowered during the squeezing and the paste permeates the screen mesh. After the permeation, the viscosity of the paste recovers to the high viscosity and, thereby, any increase of the printing width is suppressed. Therefore, a thin-line pattern is able to easily be acquired maintaining the printability such as easy permeation through the screen and, thereby, no occurrence of clogging. More preferably, the viscosity of the paste composition is in a range from 160 to 200 [Pa·s] and, more preferably, the relative viscosity is in range from 3.2 to 6.0. To reduce the line Width to a design line width of 100 [μm], preferably, the relative viscosity is 4 to 6.

To increase the film thickness such that the cross-sectional area is maintained even when the line width is reduced, is enabled by, for example, increasing the thickness of the emulsion for the printing plate-making, increasing the tension, reducing the line diameter with the opening diameter increased, etc. However, when the thickness of the emulsion is increased, the plate becomes difficult to be peeled off and, therefore, no stability of the printed pattern shape is acquired. When the tension is increased or when the line width is reduced, the screen mesh tends to be stretched and, therefore, problems arise that it is difficult to maintain the precision of the dimensions and the shapes and that the durability of the printing plate-making is degraded. In addition, a bus bar also becomes thicker whose film thickness does not need to be increased because the bus bar is provided having a large width. Therefore, another problem arises that waste of raw materials is increased.

Preferably, the paste composition for a solar battery electrode includes the electrically conductive powder for a ratio in a range from 64 to 90 weight parts and the vehicle for a ratio in a range from 3 to 20 weight parts. By setting as above, a paste composition is acquired with which an electrode is able to easily be formed that is excellent in printability, that has a small line width, and that has high electric conductivity.

As above, the electrically conductive composition of the present invention of the present application is able to suitably control the dispersion of silver during the formation of an electrode using the fire-through method and, therefore, is suitably usable for a light-receiving face electrode.

The glass frit is able to be synthesized from various raw materials that are able to be vitrified each in the above composition range, and can be, for example, an oxide, a carbonate, or a nitrate. However, for example: silicon dioxide $SiO_2$ is usable as a source of Si, boric acid $B_2O_3$ is usable as a source of B, and red lead $Pb_3O_4$ is usable as a source of Pb.

When the composition is set to include other components such as Al and Zr in addition to the main components that are Si, B, and Pb, for example, an oxide, a hydride, a carbonate, or a nitrate of any of those elements only has to be used.

MODE FOR CARRYING OUT THE INVENTION

An embodiment of the present invention will be described below in detail with reference to accompanying drawings. In the following embodiment, the drawings are each properly simplified or deformed and the dimension ratios, shapes, etc., of parts are not necessarily accurately depicted.

Figure 1:
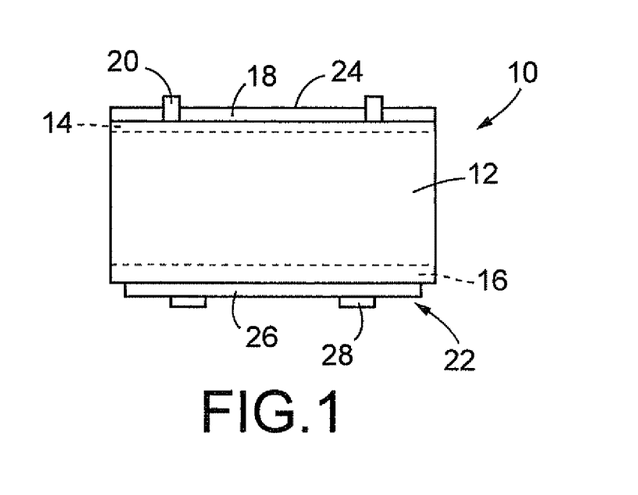
FIG. 1 is a schematic diagram of a cross-sectional structure of a solar battery whose light-receiving face electrode is formed by applying a paste composition for an electrode of an embodiment of the present invention.

FIG. 1 is a schematic diagram of a cross-sectional structure of a silicon-based solar battery 10 applied with an electrically conductive composition of an embodiment of the present invention. In FIG. 1, the solar battery 10 includes: a silicon substrate 12 that is, for example, a p-type polycrystalline semiconductor; an n-layer 14 and a $p^+$-layer 16 that are respectively formed on the top face and the bottom face of the silicon substrate 12; a reflection preventing film 18 and a light-receiving face electrode 20 that are formed on the n-layer 14; and a back face electrode 22 that is formed on the p'-layer 16. The dimension of the thickness of the silicon substrate 12 is, for example, about 100 to 200 [μm].

The n-layer 14 and the $p^+$-layer 16 are provided by forming a layer whose impurity concentration is high on each of the top face and the bottom face of the silicon substrate 12. The dimensions of the thicknesses of the high-concentration layers are, for example, about 70 to 100 [nm] for the n-layer 14 and, for example, about 500 [nm] for the $p^+$-layer 16. The n-layer 14 is about 100 to 200 [nm] for a common silicon-based solar battery. However, in the embodiment, the thickness of the n-layer 14 is smaller than that of the common silicon-based solar battery and the n-layer 14 forms a structure that is referred to as "shallow emitter". The impurity included in the n-layer 14 is an n-type dopant such as, for example, phosphorus (P) and the impurity included in the $p^+$-layer 16 is a p-type dopant such as, for example, aluminum (Al) or boron (B).

The reflection preventing film 18 is, for example, a thin film made of silicon nitride $Si_3N_4$, etc., and is configured to have a significantly low reflectance that is equal to or lower than 10 [%] such as, for example, about 2 [%] by being provided having an optical thickness of, for example, about ¼ of a visible light wavelength that is, for example, about 80 [nm]

Figure 2:
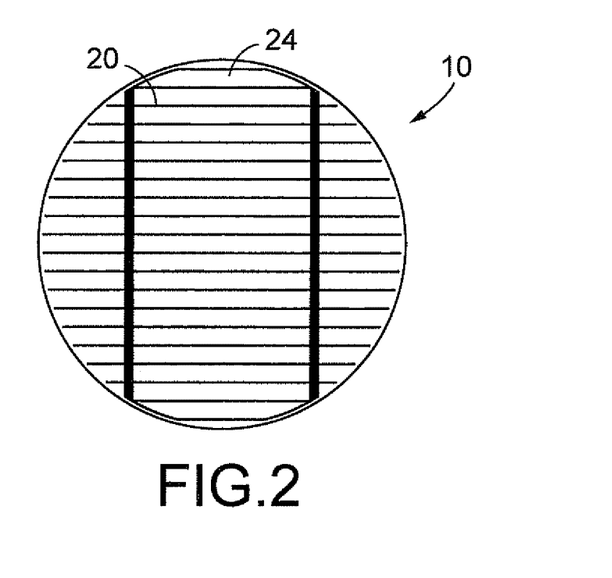
FIG. 2 is a diagram of an example of a pattern of the light-receiving face electrode of the solar battery of FIG. 1.

The light-receiving face electrode 20 is formed from, for example, a thick film conductor having an even thickness dimension and, as depicted in FIG. 2, is provided in a planar comb-like shape having many thin line portions over the substantially whole face of a light-receiving face 24. The thick film conductor is made of thick film silver that includes: Ag whose amount is within a range from 67 to 98 [wt %] such as, for example, about 94.3 [wt %]; and glass whose amount is within a range from 2 to 33 [wt %] such as, for example, about 5.7 [wt %]. The glass is a lead glass that includes, as amounts converted into those of oxides as ratios, PbO within a range from 20 to 65 [mol %] such as, for example, about 39 [mol %], $B_2O_3$ within a range from 1 to 18 [mol %] such as, for example, about 12.0 [mol %], $SiO_2$ within a range from 20 to 65 [mol %] such as, for example, about 31.0 [mol %], $Li_2O$ within a range from 0.6 to 18 [mol %] such as, for example, about 6.0 [mol %], $Al_2O_3$ within a range from 0 to 6 [mol %] such as, for example, about 3 [mol %], $TiO_2$ within a range from 0 to 6 [mol %] such as, for example, about 3 [mol %], and ZnO within a range from 0 to 30 [mol %] such as, for example, about 6 [mol %]. The thickness dimension of the conductor layer is, for example, within a range from 20 to 30 [μm] such as, for example, about 25 [μm] and the width dimension of each thin line portion is within a range, for example, from 80 to 130 [μm] such as, for example, about 100 [μm], and the conductor layer has sufficiently high electric conductivity.

The back face electrode 22 includes: a whole face electrode 26 formed by applying a thick film material including aluminum as a conductor component to the substantially whole face of the p$^+$-layer 16; and a belt-like electrode 28 made of thick film silver formed by applying the thick film silver in a belt-like shape to the whole face electrode 26. The belt-like electrode 28 is provided to enable soldering of conductor wires, etc., to the back face electrode 22.

The light-receiving face electrode 20 of the solar battery 10 of the embodiment includes as above the thick film silver including lead glass within the range from 2 to 33 [wt %] of a lead glass composition that includes as ratios PbO within a range from 20 to 65 [mol %], $B_2O_3$ within a range from 1 to 18 [mol %], $SiO_2$ within a range from 20 to 65 [mol %], $Li_2O$ within a range from 0.6 to 18 [mol %], $Al_2O_3$ within a range from 0 to 6 [mol %], $TiO_2$ within a range from 0 to 6 [mol %], and ZnO within a range from 0 to 30 [mol %], respectively. Therefore, even though its line width is reduced to about 100 [μm], excellent ohmic contact is able to be acquired between the light-receiving face electrode 20 and the n-layer 14 and the contact resistance is lowered.

Furthermore, the amount of the glass included in the light-receiving face electrode 20 of the embodiment is, as explained above, set to be a small amount of about 5.7 [wt %] and, therefore, the light-receiving face electrode 20 has high electric conductivity. Therefore, even though both of the film thickness and the line width are reduced, the line resistance is low. Therefore, with the effect of the low contact resistance, the photo-electric conversion efficiency of the solar battery 10 is improved.

The light-receiving face electrode 20 is formed using the well-known fire-through method using, for example, a paste for an electrode including conductor powder, glass frit, a vehicle, and a solvent. An example of a manufacturing method of the solar battery 10 including formation of the light-receiving face electrode will be described below.

The glass frit is first produced. Such oxides are individually prepared as: lithium carbonate $Li_2CO_3$ as a Li source; silicon dioxide $SiO_2$ as a Si source; boric acid $B_2O_3$ as a B source; red lead $Pb_3O_4$ as a Pb source; aluminum oxide $Al_2O_3$ as an Al source; titanium oxide $TiO_2$ as a Ti source; and zinc oxide ZnO as a Zn source. These oxides are weighed and mixed to acquire a proper composition within the above ranges. The mixed oxides are placed in a crucible, are melted for about 30 minutes to one hour at a temperature within a range from 900 to 1,200 [° C.] corresponding to the composition, are rapidly cooled, and, thereby, are vitrified. This glass is crushed using a proper crusher such as a planetary mill or a ball mill. The average particle diameter (D50) after the crushing is, for example, about 0.3 to 3.0 [μm].

On the other hand, for example, commercially-available silver powder having a ball-like shape whose average particle diameter (D50) is within a range from 0.3 to 3.0 [μm] is prepared as the conductor powder. By using the silver powder whose average particle diameter is sufficiently small, the filling factor of the silver powder in the coated film is able to be increased and the electric conductivity of the conductor is consequently able to be increased. The vehicle is prepared by melting an organic binder in an organic solvent. For example, butylcarbitolacetate is used as the organic solvent and, for example, ethylcellulose is used as the organic binder. The ratio of ethylcellulose in the vehicle is, for example, about 15 [wt %]. A solvent to be added separately from the vehicle is, for example, butylcarbitolacetate. Though the solvent is not limited to this, the same solvent may be used as the solvent used in the vehicle. This solvent is added for purpose of adjustment of the viscosity of the paste.

The above materials for the paste: are individually prepared; are weighed to acquire the ratios of, for example, 77 to 88 [wt %] of the conductor powder, 1 to 10 [wt %] of the glass frit, 7 to 14 [wt %] of the vehicle, and 3 to 5 [wt %] of the solvent; and are mixed using a mixer, etc. Thereafter, the mixed materials are applied with a dispersing process using, for example, a triple roll mill. Thereby, the paste for an electrode is acquired.

In this manner, the paste for an electrode is prepared. On the other hand, the n-layer 14 and the p$^+$-layer 16 are formed by diffusing or injecting impurities in/into a proper silicon substrate using a well-known method such as, for example, a thermal diffusion method or ion implantation and, thereby, the silicon substrate 12 is produced. A silicon nitride thin film is then formed on the silicon substrate 12 using a proper method such as, for example, PE-CVD (plasma CVD) and, thereby, the reflection preventing film 18 is provided.

The paste for an electrode is then screen-printed in a pattern depicted in FIG. 2 on the reflection preventing film 18. This paste is dried at, for example, 150 [° C.] and is further applied with a baking process in a near-infrared furnace at a temperature within a range from 740 to 900 [° C.]. Thereby, the glass component in the paste for an electrode melts the reflection preventing film 18 during the baking process and the paste for an electrode breaks the reflection preventing film 18. Therefore, electric contact is acquired between the conductor components in the paste for an electrode, that is, silver and the n-layer 14 and, as depicted in FIG. 1, ohmic contact is acquired between the silicon substrate 12 and the light-receiving face electrode 20. The light-receiving face electrode 20 is formed in this manner.

The back face electrode 22 may be formed after the above process steps. However, the back face electrode 22 is able to be formed by being simultaneously baked with the light-receiving face electrode 20. For forming the back face electrode 22, for example, an aluminum paste is applied to the whole back face of the silicon substrate 12 using the screen printing method, etc. and is applied with the baking process. Thereby, the whole face electrode 26 is formed that is made of an aluminum thick film. The paste for an electrode is applied in a belt-like shape to the surface of the whole face electrode 26 using the screen printing method, etc., and is applied with a baking process. Thereby, the belt-like electrode 28 is formed. Thereby, the back face electrode 22 is formed that includes the whole face electrode 26 covering the whole back face and the belt-like electrode 28 provided in a belt-like shape in a portion of the surface of the whole face electrode 26. Thereby, the solar battery 10 is acquired. At the above process steps, when the manufacture is executed using the simultaneous baking, the printing process is applied before the baking of the light-receiving face electrode 20.

The solar battery 10 was manufactured according to the above manufacturing process steps variously varying the glass composition, and the output of the solar battery 10 was measured using a commercially available solar simulator and, thereby, the fill factor (FF) value was evaluated. The result of this evaluation is shown in Table 1 together with the glass compositions. In Table 1, Nos. 1 to 4, 6 to 24, 26 to 29, 32 to 38, 41, 42, 44, 45, 47 to 50, 53 to 56, 58 to 63, 65 to 72, 74 to 91, 93 to 97, 99, and 100 are embodiment specimens and others are comparative example specimens. It is generally determined that a solar battery is usable when the FF value thereof is equal to or higher than 70. However, needless to say, an FF value is more preferable as the value is larger. In the embodiment, those each presenting the FF value exceeding 75 are determined to be acceptable.

TABLE 1

| No. | PbO | $B_2O_3$ | $SiO_2$ | $Al_2O_3$ | $Li_2O$ | $TiO_2$ | ZnO | FF [%] |
|---|---|---|---|---|---|---|---|---|
| 1 | 52.4 | 2.9 | 41.7 | — | 3.0 | — | — | >75 |
| 2 | 50.8 | 2.8 | 40.4 | — | 6.0 | — | — | >75 |
| 3 | 47.5 | 2.6 | 37.8 | — | 12.0 | — | — | >75 |
| 4 | 44.3 | 2.5 | 35.3 | — | 18.0 | — | — | >75 |
| 5 | 41.0 | 2.3 | 32.7 | — | 24.0 | — | — | 63 |
| 6 | 49.0 | 3.0 | 39.0 | — | 6.0 | — | 3.0 | >75 |
| 7 | 47.3 | 3.0 | 37.7 | — | 6.0 | — | 6.0 | >75 |
| 8 | 45.7 | 3.0 | 36.3 | — | 6.0 | — | 9.0 | >75 |
| 9 | 44.0 | 3.0 | 35.0 | — | 6.0 | — | 12.0 | >75 |
| 10 | 42.3 | 3.0 | 33.7 | — | 6.0 | — | 15.0 | >75 |
| 11 | 34.0 | 3.0 | 27.0 | — | 6.0 | — | 30.0 | >75 |
| 12 | 45.6 | 3.0 | 36.4 | 3.0 | 12.0 | — | — | >75 |
| 13 | 44.0 | 3.0 | 35.0 | 6.0 | 12.0 | — | — | >75 |
| 14 | 45.6 | 3.0 | 36.4 | — | 12.0 | 3.0 | — | >75 |
| 15 | 44.0 | 3.0 | 35.0 | — | 12.0 | 6.0 | — | >75 |
| 16 | 45.6 | 3.0 | 36.4 | — | 12.0 | — | 3.0 | >75 |
| 17 | 44.0 | 3.0 | 35.0 | — | 12.0 | — | 6.0 | >75 |
| 18 | 39.0 | 3.0 | 31.0 | — | 12.0 | — | 15.0 | >75 |
| 19 | 30.6 | 3.0 | 24.4 | — | 12.0 | — | 30.0 | >75 |
| 20 | 45.6 | 6.0 | 36.4 | — | 12.0 | — | — | >75 |
| 21 | 44.0 | 9.0 | 35.0 | — | 12.0 | — | — | >75 |
| 22 | 42.3 | 12.0 | 33.7 | — | 12.0 | — | — | >75 |
| 23 | 48.4 | 12.0 | 38.6 | — | 1.0 | — | — | >75 |
| 24 | 48.6 | 12.0 | 38.8 | — | 0.6 | — | — | >75 |
| 25 | 48.8 | 12.0 | 38.8 | — | 0.4 | — | — | 73 |
| 26 | 31.8 | 5.7 | 50.5 | — | 12.0 | — | — | >75 |
| 27 | 33.5 | 3.0 | 51.5 | — | 12.0 | — | — | >75 |
| 28 | 30.5 | 9.0 | 48.5 | — | 12.0 | — | — | >75 |
| 29 | 29.0 | 12.0 | 47.0 | — | 12.0 | — | — | >75 |
| 30 | 24.5 | 21.0 | 42.5 | — | 12.0 | — | — | 50 |
| 31 | 20.0 | 30.0 | 38.0 | — | 12.0 | — | — | 38 |
| 32 | 31.0 | 5.0 | 49.0 | 3.0 | 12.0 | — | — | >75 |
| 33 | 30.0 | 4.0 | 48.0 | 6.0 | 12.0 | — | — | >75 |
| 34 | 31.0 | 5.0 | 49.0 | — | 12.0 | 3.0 | — | >75 |
| 35 | 30.0 | 4.0 | 48.0 | — | 12.0 | 6.0 | — | >75 |
| 36 | 31.0 | 5.0 | 49.0 | — | 12.0 | — | 3.0 | >75 |
| 37 | 30.0 | 4.0 | 48.0 | — | 12.0 | — | 6.0 | >75 |
| 38 | 29.6 | 5.3 | 47.1 | — | 18.0 | — | — | >75 |
| 39 | 27.5 | 4.9 | 43.6 | — | 24.0 | — | — | 70 |
| 40 | 20.0 | 12.0 | 68.0 | — | — | — | — | 38 |
| 41 | 20.0 | 12.0 | 65.0 | — | 3.0 | — | — | >75 |
| 42 | 20.0 | 12.0 | 56.0 | — | 12.0 | — | — | >75 |
| 43 | 65.0 | 3.0 | 32.0 | — | — | — | — | 72 |
| 44 | 65.0 | 3.0 | 29.0 | — | 3.0 | — | — | >75 |
| 45 | 65.0 | 3.0 | 20.0 | — | 12.0 | — | — | >75 |
| 46 | 54.0 | — | 43.0 | — | 3.0 | — | — | 71 |
| 47 | 53.4 | 1.0 | 42.6 | — | 3.0 | — | — | >75 |
| 48 | 46.8 | 13.0 | 37.2 | — | 3.0 | — | — | >75 |
| 49 | 45.6 | 15.0 | 36.4 | — | 3.0 | — | — | >75 |
| 50 | 45.6 | 18.0 | 36.4 | — | 3.0 | — | — | >75 |
| 51 | 45.6 | 19.0 | 36.4 | — | 3.0 | — | — | 71 |
| 52 | 52.3 | — | 41.7 | — | 6.0 | — | — | 73 |
| 53 | 51.8 | 1.0 | 41.2 | — | 6.0 | — | — | >75 |
| 54 | 45.1 | 13.0 | 35.9 | — | 6.0 | — | — | >75 |
| 55 | 44.0 | 15.0 | 35.0 | — | 6.0 | — | — | >75 |
| 56 | 42.5 | 18.0 | 33.5 | — | 6.0 | — | — | >75 |
| 57 | 42.0 | 19.0 | 33.0 | — | 6.0 | — | — | 73 |
| 58 | 45.7 | 6.0 | 36.3 | — | 6.0 | — | 6.0 | >75 |
| 59 | 40.7 | 6.0 | 32.3 | — | 6.0 | — | 15.0 | >75 |
| 60 | 44.0 | 9.0 | 35.0 | — | 6.0 | — | 6.0 | >75 |
| 61 | 39.0 | 9.0 | 31.0 | — | 6.0 | — | 15.0 | >75 |
| 62 | 42.3 | 12.0 | 33.7 | — | 6.0 | — | 6.0 | >75 |
| 63 | 37.3 | 12.0 | 29.7 | — | 6.0 | — | 15.0 | >75 |
| 64 | 45.1 | 6.0 | 36.5 | 3.0 | 0.4 | 3.0 | 6.0 | 73 |
| 65 | 45.0 | 6.0 | 36.4 | 3.0 | 0.6 | 3.0 | 6.0 | >75 |
| 66 | 42.3 | 6.0 | 33.7 | 3.0 | 1.0 | 3.0 | 6.0 | >75 |
| 67 | 42.3 | 6.0 | 33.7 | 3.0 | 6.0 | 3.0 | 6.0 | >75 |
| 68 | 40.7 | 9.0 | 32.3 | 3.0 | 6.0 | 3.0 | 6.0 | >75 |
| 69 | 39.0 | 12.0 | 31.0 | 3.0 | 6.0 | 3.0 | 6.0 | >75 |
| 70 | 38.4 | 13.0 | 30.6 | 3.0 | 6.0 | 3.0 | 6.0 | >75 |
| 71 | 37.3 | 15.0 | 29.7 | 3.0 | 6.0 | 3.0 | 6.0 | >75 |
| 72 | 35.6 | 18.0 | 28.4 | 3.0 | 6.0 | 3.0 | 6.0 | >75 |
| 73 | 35.1 | 19.0 | 27.9 | 3.0 | 6.0 | 3.0 | 6.0 | 73 |
| 74 | 44.0 | 3.0 | 35.0 | 3.0 | 6.0 | 3.0 | 6.0 | >75 |
| 75 | 39.0 | 3.0 | 31.0 | 3.0 | 6.0 | 3.0 | 15.0 | >75 |
| 76 | 37.3 | 6.0 | 29.7 | 3.0 | 6.0 | 3.0 | 15.0 | >75 |
| 77 | 35.6 | 9.0 | 28.4 | 3.0 | 6.0 | 3.0 | 15.0 | >75 |
| 78 | 34.0 | 12.0 | 27.0 | 3.0 | 6.0 | 3.0 | 15.0 | >75 |
| 79 | 42.3 | 6.0 | 33.7 | — | 6.0 | 6.0 | 6.0 | >75 |
| 80 | 37.3 | 6.0 | 29.7 | — | 6.0 | 6.0 | 15.0 | >75 |
| 81 | 39.0 | 12.0 | 31.0 | — | 6.0 | 6.0 | 6.0 | >75 |
| 82 | 34.0 | 12.0 | 27.0 | — | 6.0 | 6.0 | 15.0 | >75 |
| 83 | 34.0 | 6.0 | 27.0 | 3.0 | 12.0 | 3.0 | 15.0 | >75 |
| 84 | 39.0 | 6.0 | 31.0 | 3.0 | 12.0 | 3.0 | 6.0 | >75 |
| 85 | 37.3 | 9.0 | 29.7 | 3.0 | 12.0 | 3.0 | 6.0 | >75 |
| 86 | 32.3 | 9.0 | 25.7 | 3.0 | 12.0 | 3.0 | 15.0 | >75 |
| 87 | 35.6 | 12.0 | 28.4 | 3.0 | 12.0 | 3.0 | 6.0 | >75 |
| 88 | 30.6 | 12.0 | 24.4 | 3.0 | 12.0 | 3.0 | 15.0 | >75 |
| 89 | 30.1 | 13.0 | 23.9 | 3.0 | 12.0 | 3.0 | 15.0 | >75 |
| 90 | 28.9 | 15.0 | 23.1 | 3.0 | 12.0 | 3.0 | 15.0 | >75 |
| 91 | 27.3 | 18.0 | 21.7 | 3.0 | 12.0 | 3.0 | 15.0 | >75 |
| 92 | 25.6 | 21.0 | 20.4 | 3.0 | 12.0 | 3.0 | 15.0 | 68 |
| 93 | 37.3 | 9.0 | 29.7 | — | 12.0 | 6.0 | 6.0 | >75 |
| 94 | 32.3 | 9.0 | 25.7 | — | 12.0 | 6.0 | 15.0 | >75 |
| 95 | 35.6 | 12.0 | 28.4 | — | 12.0 | 6.0 | 6.0 | >75 |
| 96 | 30.6 | 12.0 | 24.4 | — | 12.0 | 6.0 | 15.0 | >75 |
| 97 | 25.9 | 9.0 | 41.1 | 3.0 | 12.0 | 3.0 | 6.0 | >75 |
| 98 | 22.4 | 9.0 | 35.6 | 3.0 | 12.0 | 3.0 | 15.0 | >75 |
| 99 | 24.7 | 12.0 | 39.3 | 3.0 | 12.0 | 3.0 | 6.0 | >75 |
| 100 | 25.9 | 9.0 | 41.1 | — | 12.0 | 6.0 | 6.0 | >75 |

Each specimen was manufactured using Ag powder having a ball-like shape and the average particle diameter of 1.6 [μm], and glass frit having the average particle diameter of 1.5 [μm]. The preparation ratios were basically 83 [wt %] for the Ag powder, 5 [wt %] for the glass frit, 8 [wt %] for the vehicle, and 5 [wt %] for the solvent and, to equalize the printability, the amounts of the vehicle and the solvent were adjusted such that the viscosity at 20 [° C.] and 20 [rpm] was 160 to 180 [Pa·s]. The printing plate-making for forming the light-receiving face electrode 20 was executed using screen mesh made of SUS325 having the line diameter of 23 [μm], provided with an emulsion of 20 [μm]. The printing conditions were set such that the width dimension of each grid line was 100 [μm].

Table 1 shows as the embodiment systems a PbO—$B_2O_3$—$SiO_2$—$Li_2O$ four-component system, a PbO—$B_2O_3$—$SiO_2$—$Li_2O$—ZnO five-component system, a PbO—$B_2O_3$—$SiO_2$—$Li_2O$—$Al_2O_3$ five-component system, a PbO—$B_2O_3$—$SiO_2$—$Li_2O$—$TiO_2$ five-component system, a PbO—$B_2O_3$—$SiO_2$—$Li_2O$—$TiO_2$—ZnO six-component system, and a PbO—$B_2O_3$—$SiO_2$—$Al_2O_3$—$Li_2O$—$TiO_2$—ZnO seven-component system. The embodiment specimens Nos. 1 to 4, 20 to 24, 26 to 29, 38, 41, 42, 44, 45, 47 to 50, and 53 to 56 each included the four-component system. However, FF values exceeding 75 were acquired with PbO in a range from 20.0 to 65.0 [mol %], $B_2O_3$ in a range from 1.0 to 18.0 [mol %] $SiO_2$ in a range from 20.0 to 65.0 [mol %], and $Li_2O$ in a range from 0.6 to 18.0 [mol %]. For the four-component system, as to the comparative example specimens, those of Nos. 5 and 39 each including a large amount $Li_2O$ of 24.0 [mol %] presented FF values only reaching respectively 63 and 70. It is considered that this was because the erosion action became too active during the baking executed to form the electrode when the $Li_2O$ was excessive. That of No. 25 including a small amount of $Li_2O$ of 0.4 [mol %] presented an FF value also only reaching 73. Those of Nos. 30, 31, 51, and 57 each including $B_2O_3$ equal to or more than 19.0 [mol %] presented FF values only or not reaching 73. Comparing these embodiment specimens and these comparative example specimens with each other, it can be seen that, as to the four-component system, the properties were not able to be acquired when $Li_2O$ included is equal to or less than 0.4 [mol %] or equal to or more than 24.0 [mol %], or $B_2O_3$ included is equal to or more than 19.0 [mol %].

The embodiment specimens of Nos. 12, 13, 32, and 33 each included the five-component system including $Al_2O_3$. As to this system, FF values exceeding 75 were acquired for all of the specimens that each included PbO in a range from 30.0 to 45.6 [mol %], $B_2O_3$ in a range from 3.0 to 5.0 [mol %], $SiO_2$ in a range from 35.0 to 49.0 [mol %], $Al_2O_3$ in a range from 3.0 to 6.0 [mol %], and $Li_2O$ at 12.0 [mol %].

The embodiment specimens of Nos. 14, 15, 34, and 35 each included the five-component system including $TiO_2$. As to this system, FF values exceeding 75 were acquired for all of the specimens that each included PbO in a range from 30.0 to 45.6 [mol %] $B_2O_3$ in a range from 3.0 to 5.0 [mol %], $SiO_2$ in a range from 35.0 to 49.0 [mol %], $Li_2O$ at 12.0 [mol %], and $TiO_2$ in a range from 3.0 to 6.0 [mol %].

The embodiment specimens of Nos. 6 to 11, 16 to 19, 36, 37, and 58 to 63 included the five-component system including ZnO. As to this system, FF values exceeding 75 were acquired for all of the specimens that each included PbO in a range from 30.0 to 49.0 [mol %], $B_2O_3$ in a range from 3.0 to 12.0 [mol %], $SiO_2$ in a range from 24.4 to 49.0 [mol %], $Li_2O$ in a range from 6.0 to 12.0 [mol %], and ZnO in a range from 3.0 to 30.0 [mol %].

The embodiment specimens of Nos. 79 to 82, 93 to 96, and 100 included the six-component system including $Li_2O$, $TiO_2$, and ZnO, that is, including no $Al_2O_3$. As to this system, FF values exceeding 75 were acquired for all of the specimens that each included PbO in a range from 25.9 to 42.3 [mol %], $B_2O_3$ in a range from 6.0 to 12.0 [mol %], $SiO_2$ in a range from 24.4 to 41.1 [mol %], $Li_2O$ in a range from 6.0 to 12.0 [mol %], $TiO_2$ at 6.0 [mol %], and ZnO in a range from 6.0 to 15.0 [mol %].

The embodiment specimens of Nos. 65 to 72, 74 to 78, and 83 to 91 included the seven-component system including all of $Al_2O_3$, $Li_2O$, $TiO_2$, and ZnO. FF values exceeding 75 were acquired for all of the specimens that each included PbO in a range from 22.4 to 45 [mol %], $B_2O_3$ in a range from 3.0 to 18.0 [mol %], $SiO_2$ in a range from 21.7 to 41.1 [mol %], $Al_2O_3$ at 3.0 [mol %], $Li_2O$ in a range from 0.6 to 18.0 [mol %], $TiO_2$ at 3.0 [mol %], and ZnO in a range from 6.0 to 15.0 [mol %]. For the seven-component system, as to the comparative example specimens, those of Nos. 73 and 92 each including a large amount of $B_2O_3$ equal to or more than 19 [mol %] and that of No. 64 including a small amount of $Li_2O$ at 0.4 [mol %] presented FF values only or not reaching 73.

A three-component system without $Li_2O$ as that of each of the comparative example specimens Nos. 40 and 43 presented small FF values. Especially, the specimen No. 40 including a large amount of Si at 68 [mol %] presented an FF value of 38 that was an extremely low result. Another three-component system without $B_2O_3$ as that of each of the comparative example specimens Nos. 46 and 52 presented FF values that were lower than 75.

According to the evaluation result of the embodiment specimens shown in Table 1, an FF value exceeding 75 is acquired by using the glass frit having the composition within the above ranges even when the line width of the light-receiving face electrode 20 is reduced to about 100 [μm]. It is considered that this is because: even with a small amount of glass of about 5 [wt %] to the amount of the whole paste, an excellent fire-through property is acquired and, therefore, excellent ohmic contact is acquired as above; therefore, reduction of the line width of the light-receiving face electrode 20 is enabled maintaining the line resistance to be low; and an effect of an increase of the Light-receiving area is able to suitably be enjoyed. The paste composition of the embodiment includes the glass frit including the glass that includes $Li_2O$ in a range from 0.6 to 18 [mol %], IMO in a range from 20 to 65 [mol %], $B_2O_3$ in a range from 1 to 18 [mol %], and $SiO_2$ in a range from 20 to 65 [mol %] and, therefore, an excellent fire-through property is acquired when the light-receiving face electrode 20 is formed by applying the paste composition to the reflection preventing film 18. Therefore, even when the line width is reduced, excellent ohmic contact is acquired. As a result, the amount of glass is reducible maintaining the excellent ohmic contact. Therefore, the line resistance of the light-receiving face electrode 20 is further reducible. Therefore, reduction of the line width of the light-receiving face electrode 20 is enabled associated with no degradation of the ohmic contact and the line resistance. Therefore, even when the light-receiving area is increased by reducing the line width, the FT value is not lowered because the contact resistance is sufficiently low and, therefore, the solar battery 10 is acquired with high photo-electric conversion efficiency.

According to the result shown in Table 1, it can be seen that, when the composition is set to include a large amount of $Li_2O$ of, for example, 3 [mol %] or more, an excellent fire-through property is acquired for a wide range of glass compositions and the paste composition for an electrode is able to consequently be acquired with which the solar battery 10 having a high photo-electric conversion efficiency is able to be manufacture.

Table 2 below clarifies the result of evaluation of the property of the solar battery 10 after forming the light-receiving face electrode 20 thereon using the paste for an electrode that is prepared by preparing types of Ag powder each having a different average particle diameter in a range from 0.3 to 3.0 [μm] and varying the average particle diameter of the glass frit in a range from 0.3 to 4.0 [μm]. "A" to "F" in the column for the Ag powder denote the types of silver powder and the average particle diameter is 3.0 [μm] for A, 2.2 [μm] for B, 1.6 [μm] for C, 0.8 [μm] for D, 0.5 [μm] for E, and 0.3 [μm] for F, respectively. "Frit Nos." in the column for the glass correspond to "specimen Nos." shown in Table 1. "Nos." in the leftmost column are each given using a combination of an Ag powder type and a frit No. Same combinations each having a glass average particle diameter different from each other are distinguished from each other by adding branch numbers to their combination numbers. The conditions not especially mentioned are same as those for the evaluation shown in Table 1.

TABLE 2

Prepared Ag paste and its property

| | Ag powder | | Glass | | Mixture (wt %) | | | | |
|---|---|---|---|---|---|---|---|---|---|
| | Particle | Ag | Particle | | | | | | |
| No. | diameter (μm) | powder No. | diameter (μm) | Frit No. | Ag powder | Glass | Vehicle | Solvent | FF (%) |
| A69 | 3.0 | A | 1.5 | 69 | 83 | 4 | 8 | 5 | >75 |
| B69 | 2.2 | B | 1.5 | 69 | 83 | 4 | 8 | 5 | >75 |
| C69 | 1.6 | C | 1.5 | 69 | 83 | 4 | 8 | 5 | >75 |
| D69 | 0.8 | D | 1.5 | 69 | 83 | 4 | 8 | 5 | >75 |
| E69 | 0.5 | E | 1.5 | 69 | 83 | 4 | 8 | 5 | >75 |
| F69 | 0.3 | F | 1.5 | 69 | 83 | 4 | 8 | 5 | >75 |
| C69-1 | 1.6 | C | 0.8 | 69 | 84 | 3 | 8 | 5 | >75 |
| C69-2 | 1.6 | C | 3.0 | 69 | 83 | 5 | 8 | 4 | >75 |
| C78-1 | 1.6 | C | 0.5 | 78 | 88 | 1 | 7 | 5 | >75 |
| C98-1 | 1.6 | C | 1.5 | 98 | 77 | 6 | 14 | 3 | >75 |
| C68 | 1.6 | C | 1.5 | 68 | 80 | 4 | 13 | 3 | >75 |
| F98 | 0.3 | F | 0.5 | 98 | 83 | 4 | 8 | 5 | >75 |
| C69-3 | 1.6 | C | 0.3 | 69 | 88 | 1 | 7 | 5 | >75 |
| C69-4 | 1.6 | C | 4.0 | 69 | 83 | 5 | 8 | 4 | 70 |

As shown in the above evaluation result, as to specimens of A69 to F69 that each employed the frit of No. 69, FF values exceeding 75 were acquired with the Ag powder particle diameter in its full range from 0.3 to 3.0 [μm] without especially changing the mixing specification. At least in the range of the Ag powder particle diameter evaluated, the particle diameter was not especially limited and any particle diameter from 0.3 to 3.0 [μm] is usable.

In the specimens C69-1 to C68 that employed the Ag powder C, the type of glass frit and the particle diameter were variously changed. However, an FF value exceeding 75 was acquired when any of the glass frit Nos. 68, 69, 78, and 98 was used. "C69-1" and "C69-2" were set to have the same glass composition and to respectively have the glass frit particle diameters of 0.8 [μm] and 3.0 [μm]. However, excellent results were acquired from both of these specimens that had substantially same specifications except the amounts of glass that were somewhat varied. The amount of vehicle was increased in "C98-1" and "C68" for purpose of adjusting their viscosity. However, the light-receiving face electrode 20 was able to be formed in each of these specimens with the line width of 100 [μm] similarly to other specimens and FF values exceeding 75 were able to be acquired for these specimens. As to C78-1, an excellent result was acquired even with the amount of glass of 1 [wt %]. It is considered that this was because the erosion action was enhanced by setting the glass composition to include a large amount such as, for example, 6.0 [mol %] of $Li_2O$ and, therefore, even with a small amount of glass, excellent ohmic contact was acquired and the line resistance was lowered.

The specimen F98 was manufactured only changing the glass frit compared to the specimen F69 while the rest of their specification remained same and an excellent result was able to be acquired from each of them. In other words, no influence was especially recognized that was caused by the difference in glass type.

"C69-3" and "C69-4" were used to check the upper and the lower limit values of the glass particle diameter. When the frit No. 69 was used after crushing this frit to have the average particle diameter of 0.3 [μm], FF values exceeding 75 were acquired with the amount of this frit mixed of 1 [wt %]. On the other hand, when this frit was crushed to have the average particle diameter of 4.0 [μm], FF values only reached about 70 even with the amount of this frit mixed set to be 5 [wt %].

According to the above results, it can be said that: the particle diameter of the Ag powder is not especially limited and the glass type was also not especially limited when the glass type is within the range of those of the embodiment specimens shown in Table 1 while, preferably, the average particle diameter of the glass is equal to or smaller than 3.0 [μm].

As above, the present invention has been described in detail with reference to the accompanying drawings. However, the present invention is able to further be implemented in other aspects and various changes are able to be made thereto within the scope not departing from the purport thereof.

For example, in the embodiment, the reflection preventing film 18 is formed using a silicon nitride film. However, the constituent material thereof is not especially limited and the refection preventing film 18 made of any of such other various materials is similarly usable as titanium dioxide $TiO_2$ that is commonly used in a solar battery.

In the embodiment, the case has been described where the present invention is applied to the silicon-based solar battery 10. However, the substrate material to be applied with the present invention is not especially limited only when the solar battery includes a light-receiving face electrode that is able to be formed using the fire-through method.

The invention claimed is:

1. A paste composition for a solar battery electrode, that comprises electrically conductive powder, glass frit, and a vehicle, wherein:
   the glass frit is made of glass that comprises, as amounts converted into those of oxides as ratios, $Li_2O$ within a range from 0.6 to 18 mol %, PbO within a range from 30 to 65 mol %, $B_2O_3$ within a range from 1 to 18 mol %, and $SiO_2$ within a range from 20 to 65 mol %.

2. The paste composition for a solar battery electrode of claim 1, wherein:
   the glass frit has an average particle diameter (D50) within a range from 0.3 to 3.0 μm, and
   the paste comprises the glass frit at a ratio within a range from 1 to 20 vol to a whole amount of the paste.

3. The paste composition for a solar battery electrode of claim 2, wherein the electrically conductive powder is silver powder that has an average particle diameter (D50) within a range from 0.3 to 3.0 μm.

4. The paste composition for a solar battery electrode of claim 3, wherein the silver powder is powder that has a ball shape or a scale shape.

5. The paste composition for a solar battery electrode of claim 4, wherein:
   a viscosity of the paste composition at 25° C. and 20 rpm is within a range from 150 to 250 Pa s, and
   a relative viscosity is 3 to 8, that is a value acquired by dividing a viscosity at 10 rpm by a viscosity at 100 rpm.

6. The paste composition for a solar batter electrode of claim 5, wherein:
   the viscosity is within a range from 160 to 200 Pa s, and
   the relative viscosity is 3.2 to 6,0.

7. The paste composition for a solar battery electrode of claim 3, wherein:
   a viscosity of the paste composition at 25° C. and 20 rpm is within a range from 150 to 250 Pa s, and
   a relative viscosity is 3to 8, that is a value acquired by dividing a viscosity at 10 rpm by a viscosity at 100 rpm.

8. The paste composition for a solar battery electrode of claim 7, wherein:
   the viscosity is within a range from 160 to 200 Pa s, and
   the relative viscosity is 3.2 to 6.0.

9. The paste composition for a solar battery electrode of claim 2, wherein:
   a viscosity of the paste composition at 25° C. and 20 rpm is within a range from 150 to 250 Pa s, and
   a relative viscosity is 3 to 8, that is a value acquired by dividing a viscosity at 10 rpm by a viscosity at 100 rpm.

10. The paste composition for a solar battery electrode of claim 9, wherein:
    the viscosity is within a range from 160 to 200 Pa s, and
    the relative viscosity is 3.2 to 6.0.

11. The paste composition for a solar battery electrode of claim 1, wherein the electrically conductive powder is silver powder that has an average particle diameter (D50) within a range from 0.3 to 3.0 μm.

12. The paste composition for a solar battery electrode of claim 11, wherein the silver powder is powder that has a ball shape or a scale shape.

13. The paste composition for a solar battery electrode of claim 12, wherein:
    a viscosity of the paste composition at 25° C. and 20 rpm is within a range from 150 to 250 Pa s, and
    a relative viscosity is 3 to 8, that is a value acquired by dividing a viscosity at 10 rpm by a viscosity at 100 rpm.

14. The paste composition for a solar battery electrode of claim 13, wherein:
    the viscosity is within a range from 160 to 200 Pa s, and
    the relative viscosity is 3.2 to 6.0.

15. The paste composition for a solar battery electrode of claim 11, wherein:
    a viscosity of the paste composition at 25° C. and 20 rpm is within a range from 150 to 250 Pa s, and
    a relative viscosity is 3 to 8, that is a value acquired by dividing a viscosity at 10 rpm by a viscosity at 100 rpm.

16. The paste composition for a solar battery electrode of claim 15, wherein:
    the viscosity is within a range from 160 to 200 Pa s, and
    the relative viscosity is 3.2 to 6.0.

17. The paste composition for a solar battery electrode of claim 1, wherein:
    a viscosity of the paste composition at 25° C. and 20 rpm is within a range from 150 to 250 Pa s, and
    a relative viscosity is 3 to 8, that is a value acquired by dividing a viscosity at 10 rpm by a viscosity at 100 rpm.

18. The paste composition for a solar battery electrode of claim 17, wherein:
    the viscosity is within a range from 160 to 200 Pa s, and
    the relative viscosity is 3.2 to 6.0.

* * * * *